(12) United States Patent
Kajigaya

(10) Patent No.: US 7,663,936 B2
(45) Date of Patent: Feb. 16, 2010

(54) MEMORY CIRCUIT AND SEMICONDUCTOR DEVICE INCLUDING THE MEMORY CIRCUIT, THE MEMORY CIRCUIT INCLUDING SELECTORS FOR SELECTING A DATA HOLDING CIRCUIT

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 154 days.

(21) Appl. No.: 11/907,208

(22) Filed: Oct. 10, 2007

(65) Prior Publication Data
US 2008/0089106 A1 Apr. 17, 2008

(30) Foreign Application Priority Data
Oct. 12, 2006 (JP) ............................. 2006-279299

(51) Int. Cl.
*G11C 7/00* (2006.01)
(52) U.S. Cl. ..................... 365/189.02; 365/189.05; 365/205
(58) Field of Classification Search ................ 365/149, 365/189.02, 189.05, 205
See application file for complete search history.

(56) References Cited

U.S. PATENT DOCUMENTS 5,455,795 A * 10/1995 Nakao et al. ............ 365/189.05
5,463,584 A * 10/1995 Hoshino ................. 365/189.05
6,172,521 B1    1/2001 Motomura

FOREIGN PATENT DOCUMENTS

JP          10-285014          10/1998

* cited by examiner

*Primary Examiner*—Hoai V Ho
(74) *Attorney, Agent, or Firm*—McGinn IP Law Group, PLLC

(57) ABSTRACT

A semiconductor circuit of the invention comprises: a memory cell array including a plurality of memory cells formed at intersections between a plurality of word lines and a plurality of bit lines; a plurality of sense amplifiers each for amplifying data of the memory cell connected to a selected word line through the bit line; a plurality of data holding circuits each for holding data transferred from the plurality of sense amplifiers; and a plurality of selectors each for selecting a data holding circuit from a unit group including a predetermined number of the data holding circuits based on logic input data, and for externally connecting one end of the selected data holding circuit.

17 Claims, 12 Drawing Sheets

MEMORY CIRCUIT AND SEMICONDUCTOR DEVICE INCLUDING THE MEMORY CIRCUIT, THE MEMORY CIRCUIT INCLUDING SELECTORS FOR SELECTING A DATA HOLDING CIRCUIT

BACKGROUND OF THE INVENTION

1. Field of the Invention

The present invention relates to a memory circuit in which a memory cell array having a plurality of memory cells is provided and a semiconductor device in which this memory circuit is provided, and particularly relates to a semiconductor device having a configuration in which one or more logic functions are performed using a plurality of look-up tables configured by the memory circuit.

2. Description of the Related Art

In recent years, in order to use LSI for various purposes, techniques for allowing users to freely change the configuration of the LSI has been achieved. For example, a programmable logic LSI in which a large number of logic circuits are arranged, logic functions and connection relations are set according to configuration data, and it is possible to implement various logic functions by changing the configuration data. Generally when implementing a logic function of the logic circuit, a look-up table (LUT) corresponding to the desired logic function is configured in a memory, and thereby an arbitrary logic function capable of obtaining an output corresponding to a logic input having a predetermined number of bits can be implemented.

Meanwhile, the circuit scale of the programmable logic LSI is increased, a problem arises that the reconfiguration takes long time, and therefore a configuration of the programmable logic LSI is proposed in which the reconfiguration can be completed in a short time by implementing a large scale memory such as DRAM (for example, see Japanese Patent Laid-Open No. Hei 10-285014). According to a configuration disclosed therein, the entire configuration data is written to an memory element using DRAM or the like, and the configuration data is transferred to a configuration memory in a logic element, so as to achieve high-speed reconfiguration.

However, according to the above conventional configuration, since the look-up table is configured in the configuration memory, data of the look-up table written to the memory element needs to be transferred to the configuration memory, and therefore rapid reconfiguration is hindered. Then, when the memory element is used as a work RAM, a special purpose bus for connecting to the logic element is required, which causes an increase in chip area. Further, since connection information is stored in the configuration memory as well as logic information, access efficiency of the logic function is reduced. In this manner, according to the conventional configuration, even when a changeable look-up table for implementing the logic function is configured in a large scale memory circuit such as DRAM, it is difficult to utilize the look-up table effectively.

BRIEF SUMMARY OF THE INVENTION

An object of the present invention is to provide a memory circuit capable of being utilized flexibly and effectively in which a look-up table changeable, if necessary, is configured, thereby achieving various logic functions, and a semiconductor device having such a memory circuit.

An aspect of the present invention is a memory circuit comprising: a memory cell array including a plurality of memory cells formed at intersections between a plurality of word lines and a plurality of bit lines; a plurality of sense amplifiers each for amplifying data of the memory cell connected to a selected word line through the bit line; a plurality of data holding circuits each for holding data transferred from said plurality of sense amplifiers; and a plurality of selectors each for selecting a data holding circuit from a unit group including a predetermined number of said data holding circuits based on logic input data, and for externally connecting one end of the selected data holding circuit.

According to the memory circuit of the present invention, by supplying logic input data to each of the plurality of selectors at one end of the memory cell array, correspondingly a predetermined number of data holding circuits which holds data of the predetermined number of sense amplifiers can be selectively connected to the outside. In this case, if a look-up table is configured by a predetermined number of memory cells for each word line corresponding to each selector, a plurality of logic functions for obtaining logic output data corresponding to the logic input data can be achieved. Accordingly, the memory circuit is used as the look-up table while being used in other applications, thereby achieving a memory circuit capable of being utilized flexibly and effectively.

The present invention may further comprise: a column decoder for selectively activating a plurality of select control lines in response to an input column address; and a select circuit connected between said plurality of sense amplifiers and input/output lines and controlled to be on/off by one or more activated select control lines.

By this configuration, in addition to the above-mentioned effect, the look-up table of the memory circuit is used while other areas thereof can be used as a work area or the like, thereby effectively achieving high-speed access In the present invention, the plurality of select control lines may extend along the plurality of bit lines, and the input/output lines may extend in a direction intersecting the bit lines.

In the present invention, the logic input data may be K (K is an integer larger than or equal to 1) bits and the unit group of data holding circuits may include $2^K$ data holding circuits.

In the present invention, a plurality of look-up tables including $2^K$ pieces of data each for achieving a predetermined logic function corresponding to each of said plurality of selectors may be configured for each of the word lines in all or part of said memory cell array.

In the present invention, when reading data from said memory cell array, logic output data may be output to outside from the look-up table through the data holding circuit selected by the selector, and when writing data to said memory cell array, input data from outside may be written to a predetermined memory cell through the data holding circuit selected by the selector.

In the present invention, in said memory cell array, two bit lines as a complementary pair may constitute a bit line pair, the memory cell may be formed at one of two intersections between the bit line pair and the word line, and the sense amplifier and the data holding circuit may be arranged corresponding to the bit line pair.

In the present invention, each of said data holding circuits may include a latch circuit for holding data transferred from the sense amplifier through one of the bit line pairs, and two switch transistors for switching connection states between two bit lines of the bit line pair and the latch circuit in response to a transfer control signal.

In the present invention, each of said data holding circuits may include one or more latch circuits for selectively holding data transferred from P (P is an integer larger than or equal to 2) of the sense amplifiers through P of the bit line pairs, and first to P-th switch transistors each of which is composed of two switch transistors for switching connection states between two bit lines of the bit line pair and the latch circuit in response to transfer control signals different to each other.

In the present invention, said plurality of sense amplifiers, said plurality of data holding circuits and said plurality of selectors may be symmetrically arranged at both ends in a bit line extending direction.

In the present invention, said plurality of sense amplifiers, said select circuit, the input/output lines, said plurality of data holding circuits and said plurality of selectors may be symmetrically arranged at both ends in a bit line extending direction.

An other aspect of the present invention is a memory semiconductor device comprising: a plurality of look-up tables configured by the above-mentioned (claim 1) memory circuit; a plurality of logic blocks each including a logic circuit for performing a predetermined logic function by selectively reading out said plurality of look-up tables through said plurality of selectors; and a plurality of connecting circuits for changeably setting a connection state of said plurality of logic blocks.

In the present invention, the memory circuit may be a DRAM circuit.

Further, an other aspect of the present invention is a semiconductor device comprising: a plurality of look-up tables configured by the above-mentioned (claim 2) memory circuit; a plurality of logic blocks each including a logic circuit for performing a predetermined logic function by selectively reading out said plurality of look-up tables through said plurality of selectors; an input/output circuit for transferring data from/to outside at least through the input/output lines of the memory circuit; and a plurality of connecting circuits for changeably setting connection states between said plurality of logic blocks and between said plurality of logic blocks and the input/output circuit.

In the present invention, the memory circuit may be a DRAM circuit having a general input/output interface.

As described above, according to the present invention, a plurality of data holding circuits for holding data transferred from a plurality of sense amplifiers, and a plurality of selectors for selectively connecting a predetermined number of the data holding circuits to outside are added to a memory circuit, and thus a memory circuit having a configuration suitable for a plurality of look-up tables for achieving logic functions can be provided. By this memory circuit, it is possible to rapidly access to the look-up table from the outside with a simple configuration while using the memory circuit also for other applications, and to achieve a memory circuit capable of being utilized flexibly and effectively. Further, by configuring a semiconductor device in which such a memory circuit is implemented, the look-up tables can be rapidly changed, and a semiconductor device having multi-functions and convenience can be provided.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiments of the present invention will be described with reference to the accompanying drawings. Hereinafter, two embodiments will be described in which a plurality of look-up tables (hereinafter referred to as "LUT") for implementing desired logic functions is configured by a DRAM circuit.

First Embodiment

Figure 1:
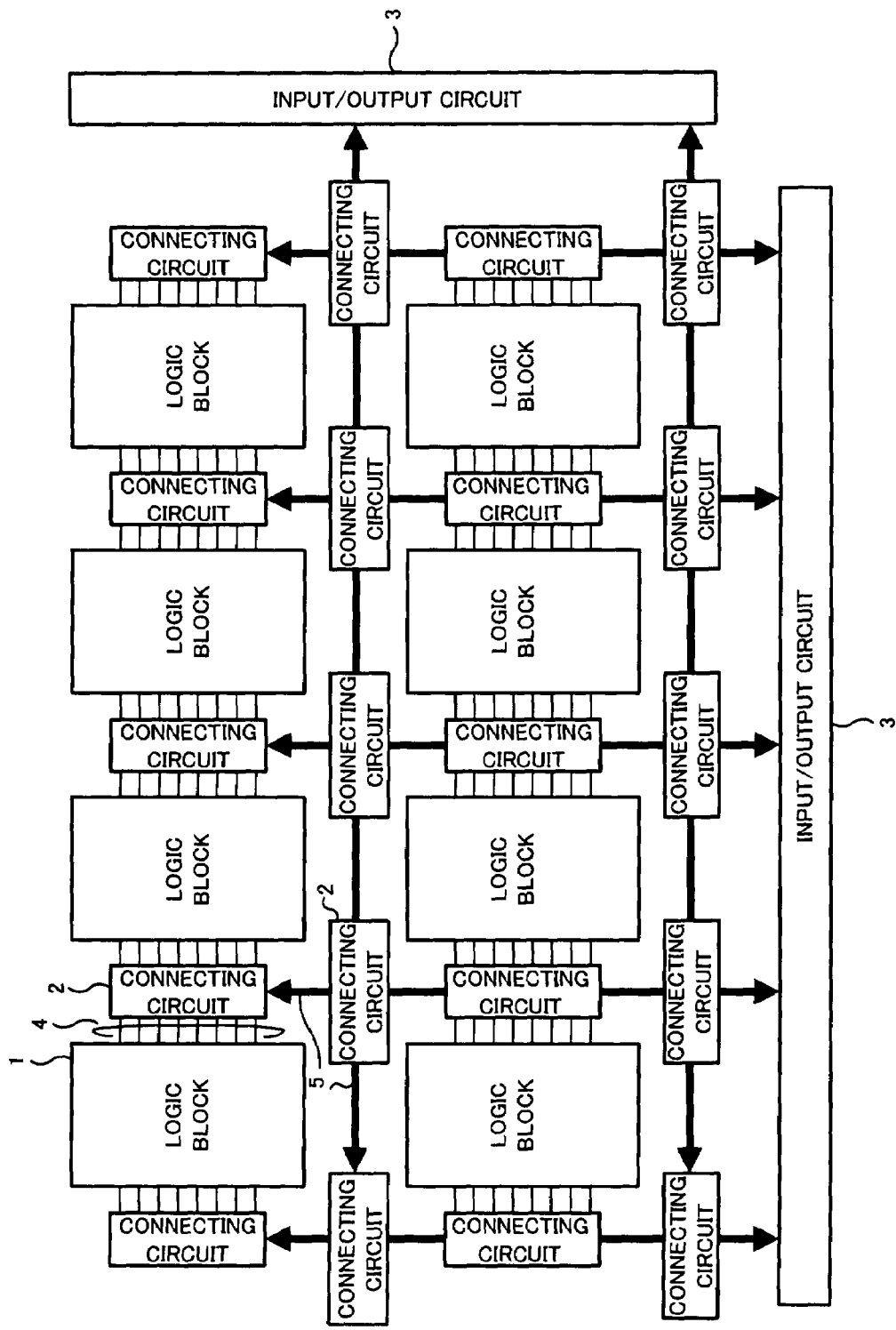
FIG. 1 is a block diagram showing an entire configuration of a programmable logic LSI as an example of a semiconductor device of a first embodiment.
Figure 2:
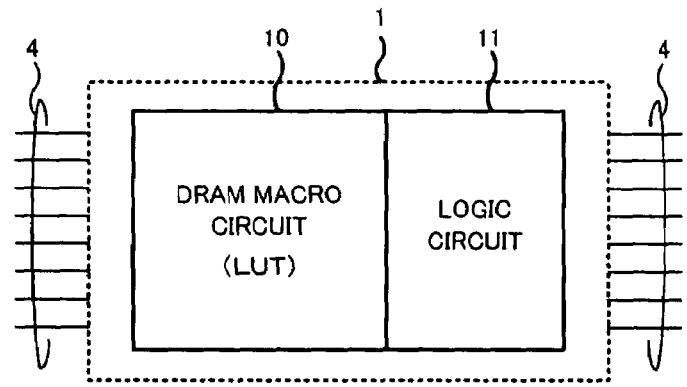
FIG. 2 is a block diagram showing a configuration of a logic block of FIG. 1.
Figure 3:
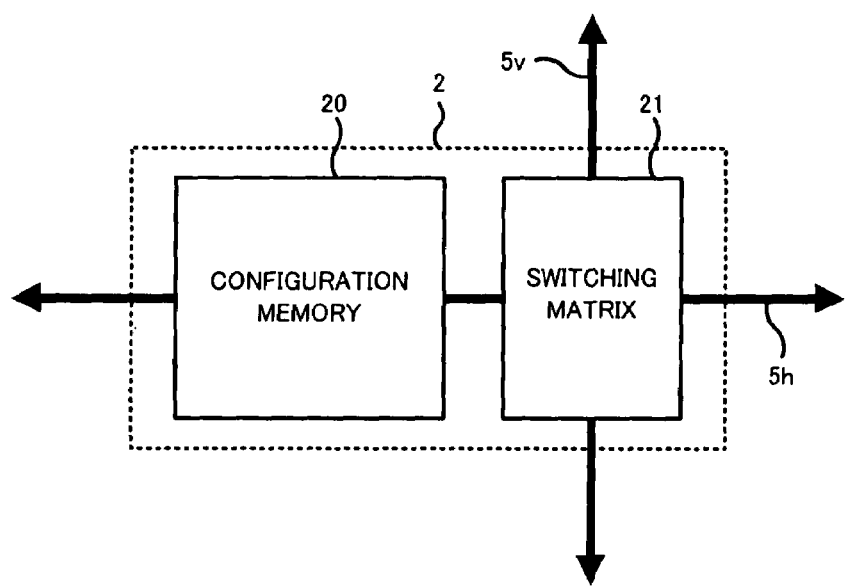
FIG. 3 is a block diagram showing a configuration of a connecting circuit of FIG. 1.

In a first embodiment, a case will be described in which a DRAM circuit having a plurality of LUT configured in a memory cell array is implemented in a semiconductor device. FIG. 1 is a block diagram showing an entire configuration of a programmable logic LSI as an example of the semiconductor device of the first embodiment. The programmable logic LSI as shown in FIG. 1 includes a plurality of logic blocks 1 each serving as a predetermined logic function, a plurality of connecting circuits 2 for switching connection paths of data input/output from/to the logic blocks 1, two input/output circuits 3 for transferring data between inside and outside the semiconductor device. Further, input/output lines 4 connecting between the logic blocks 1 and the connecting circuits 2, and a connection bus 5 connecting between the connecting circuits 2 and between each connecting circuit 2 and each input/output circuit 3 are arranged. FIGS. 2 and 3 show configurations of the logic block 1 and the connecting circuit 2, respectively included in the configuration of FIG. 1.

The logic block 1 is a circuit having a predetermined logic function represented by the LUT. As shown in FIG. 2, the logic block 1 includes a DRAM macro circuit 10 functioning as a plurality of LUTs and a logic circuit 11 for performing a predetermined logic operation. The DRAM macro circuit 10 having the plurality of LUTs rewritably stores LUT data different for each word line, and desired LUT data can be selectively read from the DRAM macro circuit 10. Input/output data having a predetermined number of bits is transmitted through the input/output lines 4 connected to the logic block 1, as described later, and the logic block 1 can perform a logic operation using the LUT through the input/output lines 4. In addition, FIG. 2 shows an example in which eight lines are included in the input/output lines 4, but the actual bit width changes according to the number of the bit lines.

As shown in FIG. 3, the connecting circuit 2 includes a configuration memory 20 for storing configuration data, and a switching matrix 21 having a large number of switches arranged in a matrix form. Connection state of the switch matrix 21 is designated based on the configuration data stored in the configuration memory 20. In the switch matrix 21, the large number of switches can be selectively connected to a horizontal connection bus 5h or a vertical connection bus 5v in accordance with the designated connection state. The horizontal connection bus 5h has lines extending in a horizontal direction, and the vertical connection bus 5v has lines extending in a vertical direction. In this case, the connection state of the switching matrix 21 can be freely changed by rewriting the configuration data of the configuration memory 20.

Returning to FIG. 1, ten of twenty connecting circuits 2 are connected to the logic blocks 1 adjacent in the horizontal direction through the input/output lines 4, and the remaining ten connecting circuits 2 are connected to the connecting circuits 2 and the input/output circuits 3 adjacent in the horizontal or vertical directions through the connection bus 5. By such connections, data can be transferred between an arbitrary logic block 1 and the outside through the plurality of connecting circuits 2 and the input/output circuit 3.

Although the example of the programmable logic LSI in FIG. 1 include eight logic blocks 1 and twenty connecting circuits 2, the number of the logic blocks 1 and the number of the connecting circuits 2 can be freely selected. Further, the arrangement and the connection form of the logic blocks 1, the connecting circuits 2 and the input/output circuits 3 are not limited to FIG. 1, and can be variously selected.

Figure 4:
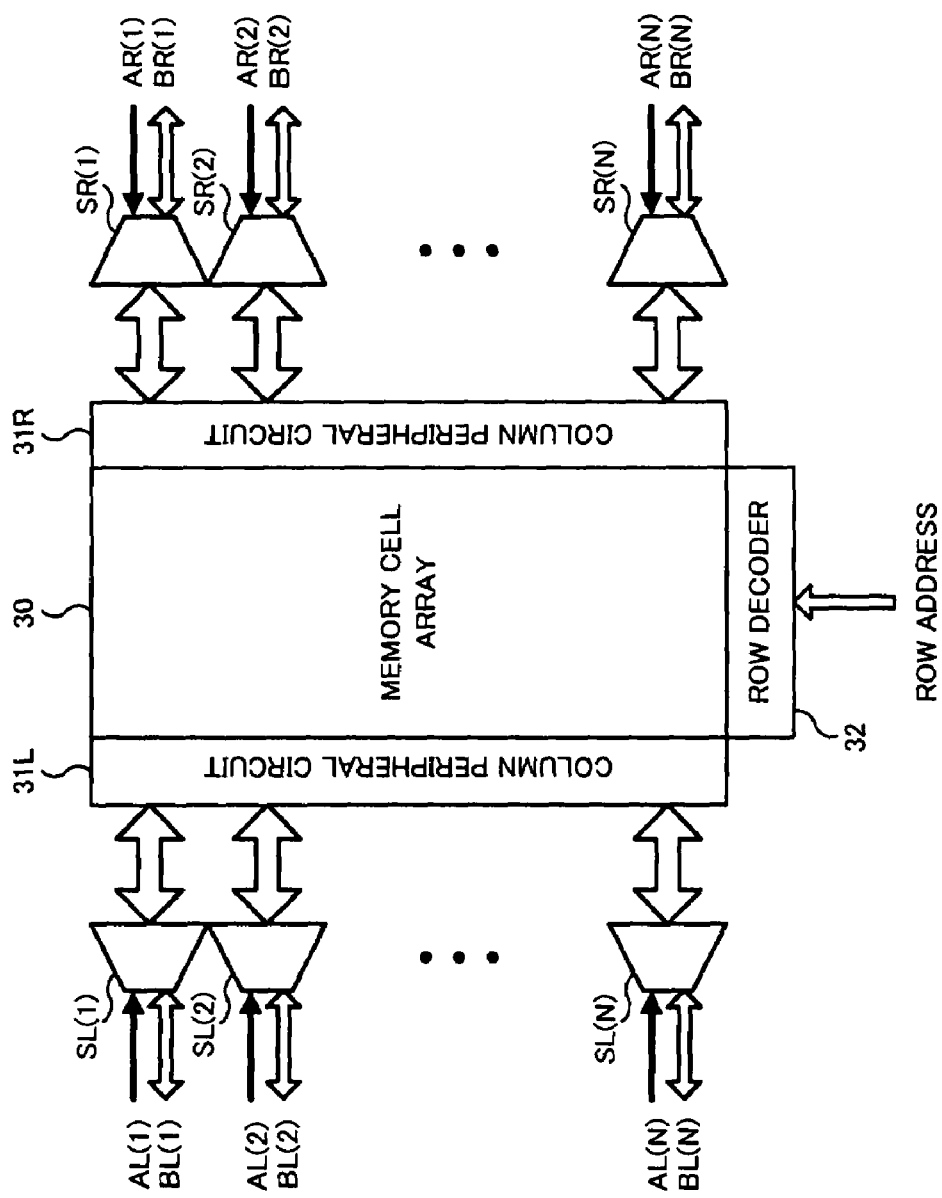
FIG. 4 is a block diagram showing a schematic configuration of a DRAM macro circuit of the first embodiment.

Next, specific configuration and operation of the DRAM macro circuit 10 in the logic block 1 will be described. FIG. 4 is a block diagram showing a schematic configuration of the DRAM macro circuit 10. The DRAM macro circuit 10 as shown in FIG. 4 includes a memory cell array 30, two column peripheral circuits 31L and 31R, a row decoder 32, and a plurality of selectors SL and SR. FIG. 4 shows one memory cell array 30 for the simplicity of description, the present invention can be applied to a memory cell array 30 divided into a plurality of areas or banks.

In FIG. 4, the memory cell array 30 includes a large number of memory cells formed at intersections between a plurality of bit lines and a plurality of word lines intersecting therewith. The column peripheral circuits 31L and 31R are respectively arranged at both ends in a bit line extending direction of the memory cell array 30, and include circuits such as sense amplifiers or latch circuits. Detailed configurations of the memory cell array 30 and the column peripheral circuits 31L and 31R will be described later. Meanwhile, the row decoder 32 is arranged at one end in a word line extending direction of the memory cell array 30, and selectively activates a word line corresponding to an input row address.

As the selectors SL and SR which are a feature of the configuration of the invention, N selectors SL(1) to SL (N) connected to one column peripheral circuit 31L, and N selectors SR(1) to SR(N) connected to the other column peripheral circuit 31R are respectively represented in FIG. 4. In these 2N selectors SL and SR, logic input data AL and AR each having a predetermined number of bits are input, while logic output data BL and BR each having one bit corresponding to the logic input data AL and AR are selectively output, which are selected among the LUT data having a predetermined number of bits corresponding to a selected word line in the memory cell array 30. For example, when the logic circuit 11 of FIG. 2 reads out the logic output data BL and BR, the logic input data AL and AR are supplied to the respective selectors SL and SR, and a desired logic function can be implemented in the logic circuit 11 by using the logic output data BL and BR output from the selectors SL and SR.

Figure 5:
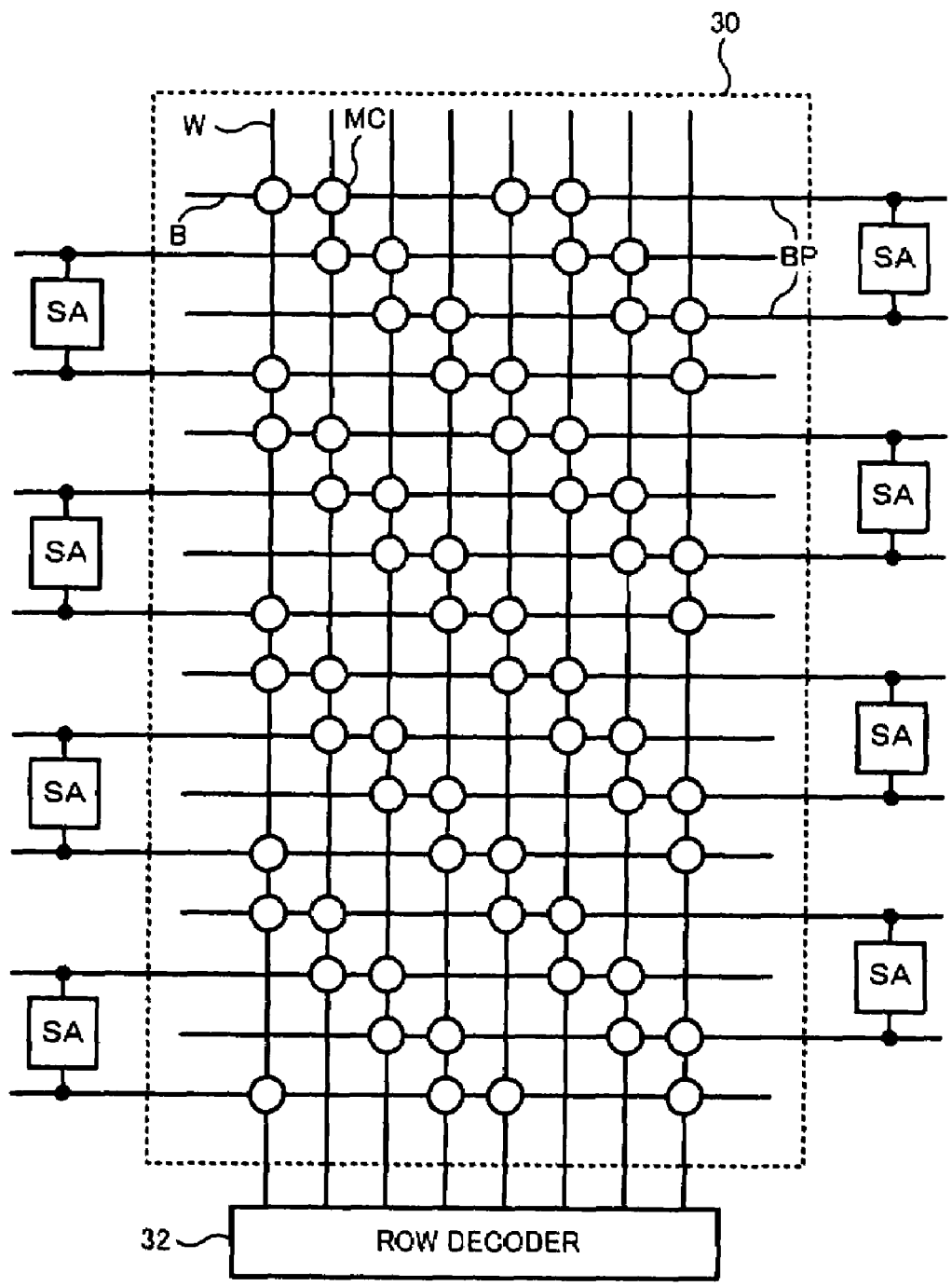
FIG. 5 is a diagram showing a specific configuration of a memory cell array of FIG. 4.

FIG. 5 shows a specific configuration of the memory cell array 30 of FIG. 4. In the memory cell array 30, a plurality of word lines W and a plurality of bit lines B intersecting therewith are arranged, and a large number of memory cells MC are formed at intersections between the word lines W and the bit lines B. In FIG. 5, a plurality of sense amplifiers SA on both sides and the row decoder 32 are also shown in addition to the memory cell array 30. For the convenience of explanation, an example in which 8 word lines W and 16 bit lines B are arranged in the memory cell array 30 is shown, but the actual memory cell array 30 can be configured by arranging a larger number of word lines W and a larger number of bit lines B.

Two bit lines B as a set constitute a bit line pair BP. As shown in FIG. 5, a single memory cell MC is formed at one of two intersections between each bit line pair BP and one word line W. Accordingly, since there are 128 (8×16) intersections in FIG. 5, half 64 memory cells MC are formed. The arrangement pattern for the intersections of memory cells MC of FIG. 5 is an example, and thus various arrangement patterns capable of storing the same data can be employed.

As shown in FIG. 5, the bit line pairs BP are alternately connected to the sense amplifiers SA on the both sides. That is, four bit line pairs BP are connected to the left side sense amplifiers SA, while remaining four bit line pairs BP are connected to the right side sense amplifiers SA. Meanwhile, all the word lines W are connected at one ends thereof to the row decoder 32.

Figure 6:
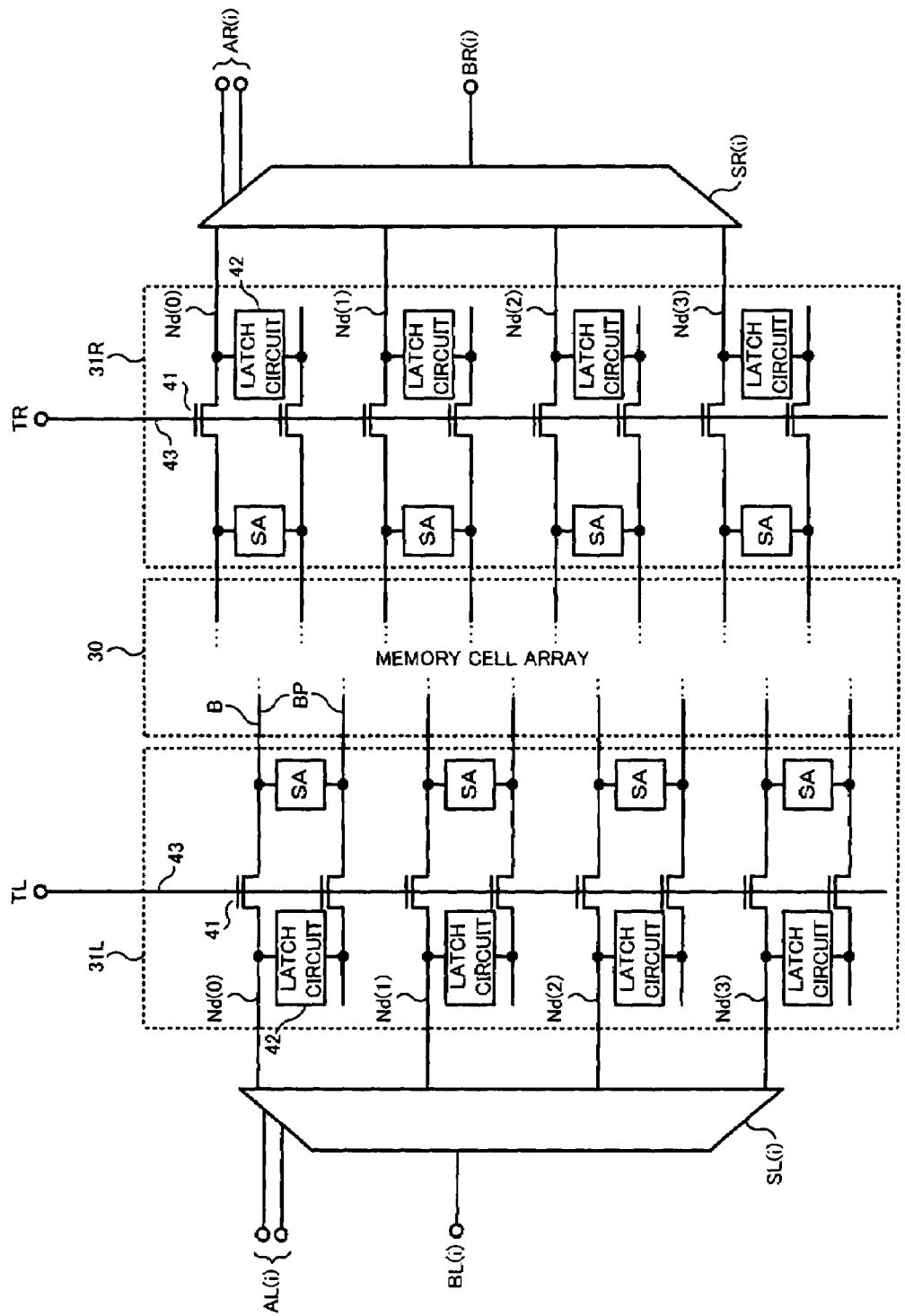
FIG. 6 is a diagram showing a specific configuration of column peripheral circuits and selectors of FIG. 4.

FIG. 6 shows a specific configuration of the column peripheral circuits 31L and 31R and the selectors SL and SR of FIG. 4. In FIG. 6, a circuit portion corresponding to two selectors SL(i) and SR(i) on both sides located at an i-th position from the upper side of FIG. 4 in the selectors SL and SR. Since the memory cell array 30 includes eight bit line pairs BP in this case, the bit line pairs BP corresponding to the same circuit portion is included in FIG. 6.

Each of the column peripheral circuits 31L and 31R includes one sense amplifier SA, two switch transistors 41 and one latch circuit 42 as constituent elements attached to each single bit line pair BP from the near side of the memory cell array 30. In addition, the arrangement of the sense amplifiers SA, the two switch transistors 41 and the latch circuits 42 are approximately symmetrical in the column peripheral circuits 31L and 31R on the both sides.

In the configuration of FIG. 6, the sense amplifier SA is arranged in the same manner as in FIG. 5, and two input terminals thereof are connected between two bit lines B of the bit line pair BP. The sense amplifier SA operates to amplify a minute potential of the bit line pair BP generated due to accumulate charge of the memory cell MC and to rewrite it to the memory cell MC.

The switch transistor 41 is inserted in series in each bit line B, and is controlled to be on/off in response to a control line 43 connected to the gate. The latch circuit 42 has two input terminals respectively connected to the switch transistors 41, and holds data amplified by the sense amplifier SA. The latch circuit 42 functions as the data holding circuit of the invention in connection with the switch transistors 41. When two switch transistors 41 corresponding to each bit line pair BP are on, each sense amplifier SA is directly connected to the latch circuit 42 and data of the sense amplifier SA is immediately transferred to the latch circuit 42. However, when the two switch transistors 41 are off, the sense amplifier SA is disconnected from the latch circuit 42.

As shown in FIG. 6, the control line 43 is commonly connected to gates of all the switch transistors 41 of the column peripheral circuit 31L. Then, a transfer control signal TL is applied from a control circuit (not shown) to the control line 43, and the transfer control signal TL is controlled to be high at the time when the amplification of each sense amplifier SA is completed. Thereby, data of the sense amplifier SA at this point is transferred to the latch circuit 42 through the switch transistors 41 for each bit line pair BP. Subsequently, the switch transistors 41 are controlled to be off at a predetermined timing, and the sense amplifier SA is disconnected from the latch circuit 42. Thereafter, even if the operating state of the sense amplifier SA changes, the latch circuit 42 continues to hold the original data.

Here, in the right side column peripheral circuit 31R, a transfer control signal TR is applied from the above control circuit to the control line 43, and the same operation as in the left side column peripheral circuit 31L can be performed. In this case, since two transfer control signals TL and TR are different, transfer operations to the latch circuits 42 in the column peripheral circuits 31L and 31R on the both sides can be independently controlled.

The left side selectors SL(i) selects one bit line B among four bit lines B at the respective one ends in response to four patterns of 2-bit logic input data AL(i) and connects the selected bit line B to a line of logic output data BL(i), in which four latch circuits 42 are dealt with as a unit. In FIG. 6, respective nodes Nd corresponding to one ends of the four latch circuits 42 connected to the left side selector SL(i) are represented as Nd(0), Nd(1), Nd(2) and Nd(3). The LUT data for implementing an arbitrary logic function is stored in the memory cells MC which are output to the above four nodes Nd. Thereby, the selector SL(i) serves as a logic function of two input/one output when seeing from the connecting circuits 2 of FIG. 1 or the logic circuit 11 of FIG. 2.

As an example of a connection relation of the selector SL(i), a configuration can be employed in which the uppermost node Nd(0) is connected when AL(i)=(0, 0) is input, the second node Nd(1) is connected when AL(i)=(0, 1) is input, the third node Nd(2) is connected when AL(i)=(1, 0) is input, and the fourth node Nd(3) is connected when AL(i)=(1, 1) is input. Three nodes Nd except selectively connected one node Nd are disconnected. If the logic output data BL(i) of 0, 0, 0, 1 are sequentially output corresponding to the above connection order, an AND function as the above logic function can be achieved.

Regarding the right side selectors SR(i), the same select control is performed in response to four patterns of 2-bit logic input data AR(i). In this case, the selectors SL(i) and SR(i) on the both sides can be used as independent LUTs for implementing different logic functions, and can be controlled by different logic input data AL(i) and AR(i).

Meanwhile, the selectors SL(i) and SR(i) can be used in writing operation of the LUT data in addition to selective reading operation of the LUT data. For example, the logic output data BL(i) input from outside can be selectively transferred to the latch circuits 42 corresponding to the four nodes Nd, in response to the desired logic input data AL(i). Subsequently, by writing data of the latch circuit 42 to a memory cell MC of a corresponding bit line pair BP, the desired LUT can be rewritten.

Configuration and operation of the selectors SL(i) and SR(i) shown in FIG. 6 are common to the 2N selectors SL and SR in the entire column peripheral circuits 31L and 31R on the both sides. Accordingly, N-bit logic output data group are selected through bit line pairs BP corresponding to 4N latch circuits 42 in total for N selectors SL on the left side in FIG. 4. The right side selectors SR of FIG. 4 are the same. Therefore, 8N bit line pairs BP are arranged in the entire memory cell array 30, and 2N-bit logic output data group can be selectively read out through the selectors SL and SR corresponding to one word line W.

Further, if the number of word lines W included in the memory cell array 30 is M, contents of 8N-bit LUT stored in memory cells MC can be changed for each word line W, and thus maximum 8N×M bit LUT data can be stored in the memory cell array 30. However, a partial area of the memory cell array 30 may be assigned for the LUT data, while other area may be used as a general work area. In this case, data can be input/output through the above selectors SL and SR from/to the area which is used as the work area in the memory cell array 30.

In the above described configuration, each of the selectors SL and SR selects 1-bit logic output data BL or BR from 4-bit LUT data, based on 2-bit logic input data AL or AR. However, the configuration of the selectors SL and SR can be freely changed. A configuration can be employed in which 1-bit logic output data is selected from $2^K$-bit LUT data, based on K-bit logic input data. In this case, if N selectors SL and N selectors SR are provided, $2N \cdot 2^K$ bit line pairs BP are arranged in the memory cell array 30.

Figure 7:
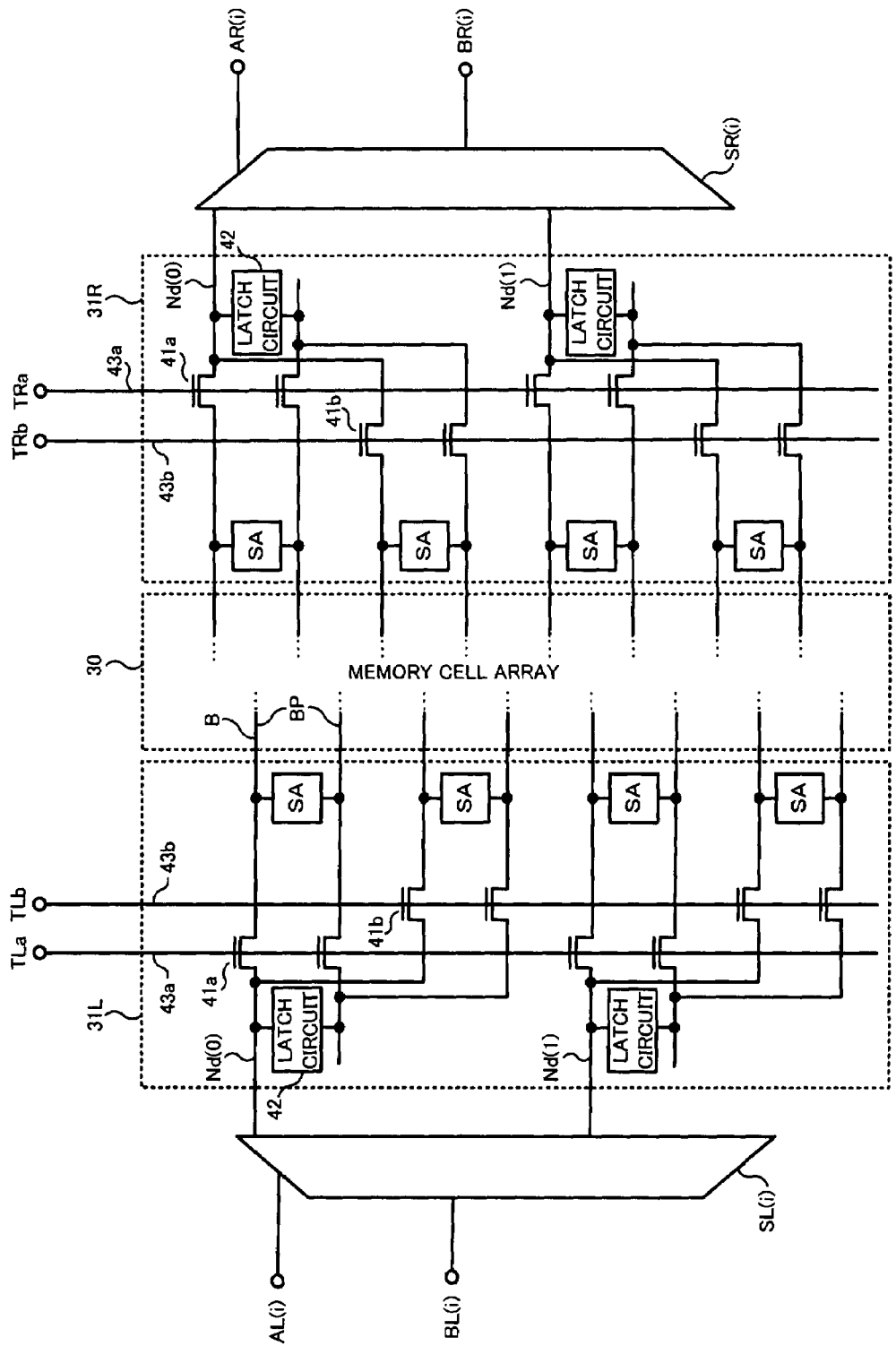
FIG. 7 is a diagram showing a configuration of a modification corresponding to the configuration of FIG. 6.

Next, a modification corresponding to the configuration of FIG. 6 will be described. FIG. 7 shows a specific configuration of the column peripheral circuits 31L and 31R and the selectors SL and SR in the modification of the DRAM macro circuit 10. In FIG. 7, every other bit line pairs BP has a different configuration in the column peripheral circuits 31L and 31R. That is, a portion in which the sense amplifier SA, two switch transistors 41a and the latch circuit 42 are arranged from the near side of the memory cell array 30, and a portion in which the sense amplifier SA and two switch transistors 41b are arranged, are alternately repeated.

In the left side column peripheral circuit 31L, a control line 43a is commonly connected to gates of one switch transistors 41a, and a control line 43b is commonly connected to gates of the other switch transistor 41b. Then, a transfer control signal TLa is applied to the control line 43a, and a transfer control signal TLb is applied to the control line 43b, respectively from a control circuit (not shown). In this case, either of the transfer control signals TLa and TLb is controlled to be high, and data of two of four sense amplifiers SA are transferred to two latch circuits 42. In this manner, the sense amplifiers SA targeted for data transfer can be switched in response to the control signals TLa and TLb.

Further, 1-bit logic input data AL(i) is input to the left side selector SL(i). Then, two nodes Nd(0) and Nd(1) corresponding to one ends of two latch circuits 42 are connected to the selector SL(i), and one bit of the 2-bit LUT data is selected. By comparing the configuration of FIG. 7 with that of FIG. 6, the number of the LUT data corresponding to the logic functions for each selector SL(i) is reduced by half. However, since the LUT data corresponding to two types of the logic functions can be switched by switching the transfer control signals TLa and TLb, the number of total data remains the same.

Meanwhile, in the right side column peripheral circuit 31R, the above switch transistors 41a and 41b and the control lines 43a and 43b are arranged symmetrically to the left side column peripheral circuit 31L. Then, a transfer control signal TRa is applied to the control line 43a, and a transfer control signal T Rb is applied to the control line 43b, respectively from the control circuit (not shown). In this case, either of the transfer control signals TRa and TRb is controlled to be high, and data of two of four sense amplifiers SA are transferred to two latch circuits 42. In this manner, the right side selector SR(i) can be controlled independently of the left side selector SL(i) in response to the transfer control signals TRa and TRb.

Herein, in the modification FIG. 7, the two bit line pairs BP and the two sense amplifiers SA are commonly connected to one latch circuit 42, however it is possible to achieve an expanded configuration in which P bit line pairs BP and P sense amplifiers SA are commonly connected to one latch circuit 42. In this case, P pairs (2P) of the switch transistors 41 connected between each of P sense amplifiers SA and the latch circuit 42 need to be provided corresponding to P different transfer control signal.

Figure 8:
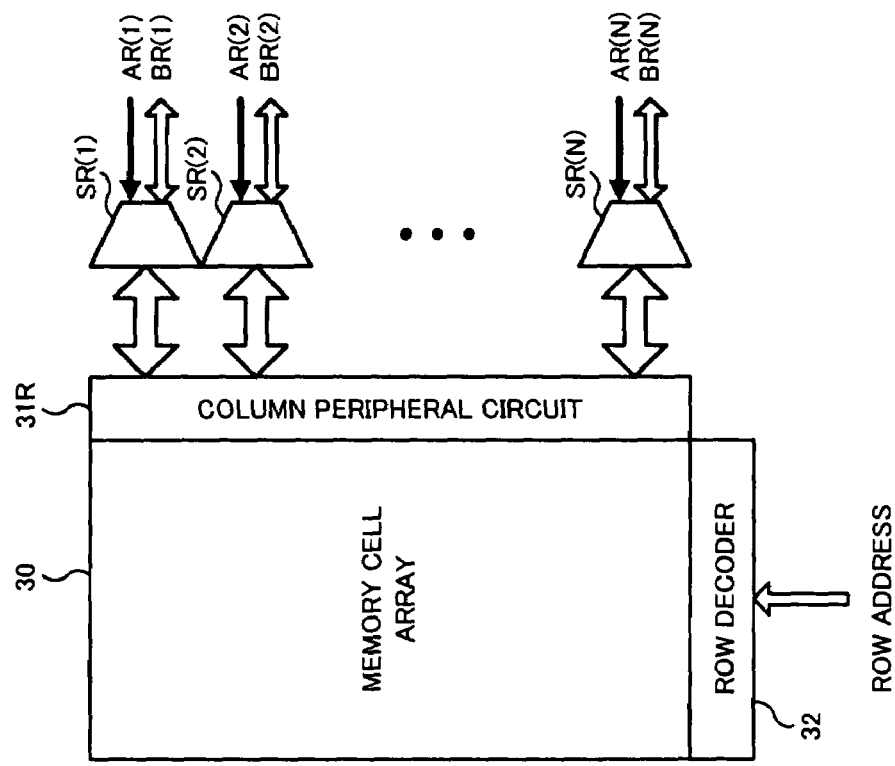
FIG. 8 is a block diagram showing a modification regarding the schematic configuration of the DRAM macro circuit of the first embodiment.

Next, a modification of the schematic configuration of the DRAM macro circuit 10 of the first embodiment is shown. Although the case has been described in which the column peripheral circuits 31L and 31R and the selectors SL and SR are arranged in both sides of the memory cell array 30, FIG. 8 shows the modification in which these elements are arranged on one side of the memory cell array 30. In the modification of FIG. 8, the column peripheral circuit 31R and N selectors SR(1) to SR(N) are arranged only on the right side of the memory cell array 30. Meanwhile, the column peripheral circuit 31L and N selectors SL(1) to SL(N) are not provided on the left side of the memory cell array 30, which is different from the case of FIG. 4.

The modification of FIG. 8 corresponds to a configuration in which the bit line pairs BP and the sense amplifiers SA are not alternately connected and a large number of sense amplifiers SA are arranged only on one side of the bit line pairs BP. By comparing FIG. 8 with FIG. 4, if the number of the bit line pairs BP, the LUT data capable of being stored for each word line W has the same size. A specific configuration of the column peripheral circuit 31R and the selectors SR(1) to SR(N) can be considered in the same manner as the right side circuit portion shown in FIG. 6 or 7. In addition, by interchanging the left and right sides in FIG. 8, the column peripheral circuit 31L and the N selectors SL(1) to SL(N) may be arranged only on the left side of the memory cell array 30.

As described above, a plurality of LUT for implementing various logic functions in the logic block 1 is configured by the DRAM macro circuit 10 of the first embodiment, and the LUT data necessary in the logic operation can be rapidly read out. Thus, the LUT data can be stored in all or part of the memory cell array 30 of the DRAM macro circuit 10 without providing a special purpose memory for the LUT. Thereby, the DRAM macro circuit 10 can be utilized efficiently and flexibly, for example, the memory cell array 30 is shared for the LUT data and for the work area. Further, by implementing the DRAM macro circuit 10 of the first embodiment in a semiconductor device such as a programmable logic LSI, the DRAM macro circuits 10 functioning as a plurality of LUT are arranged integrally with a large number of logic circuits 11, thereby rapidly performing various logic functions. Then, a configuration capable of simply changing the LUT data is realized, thereby improving the integration of the entire chip.

Second Embodiment

Figure 9:
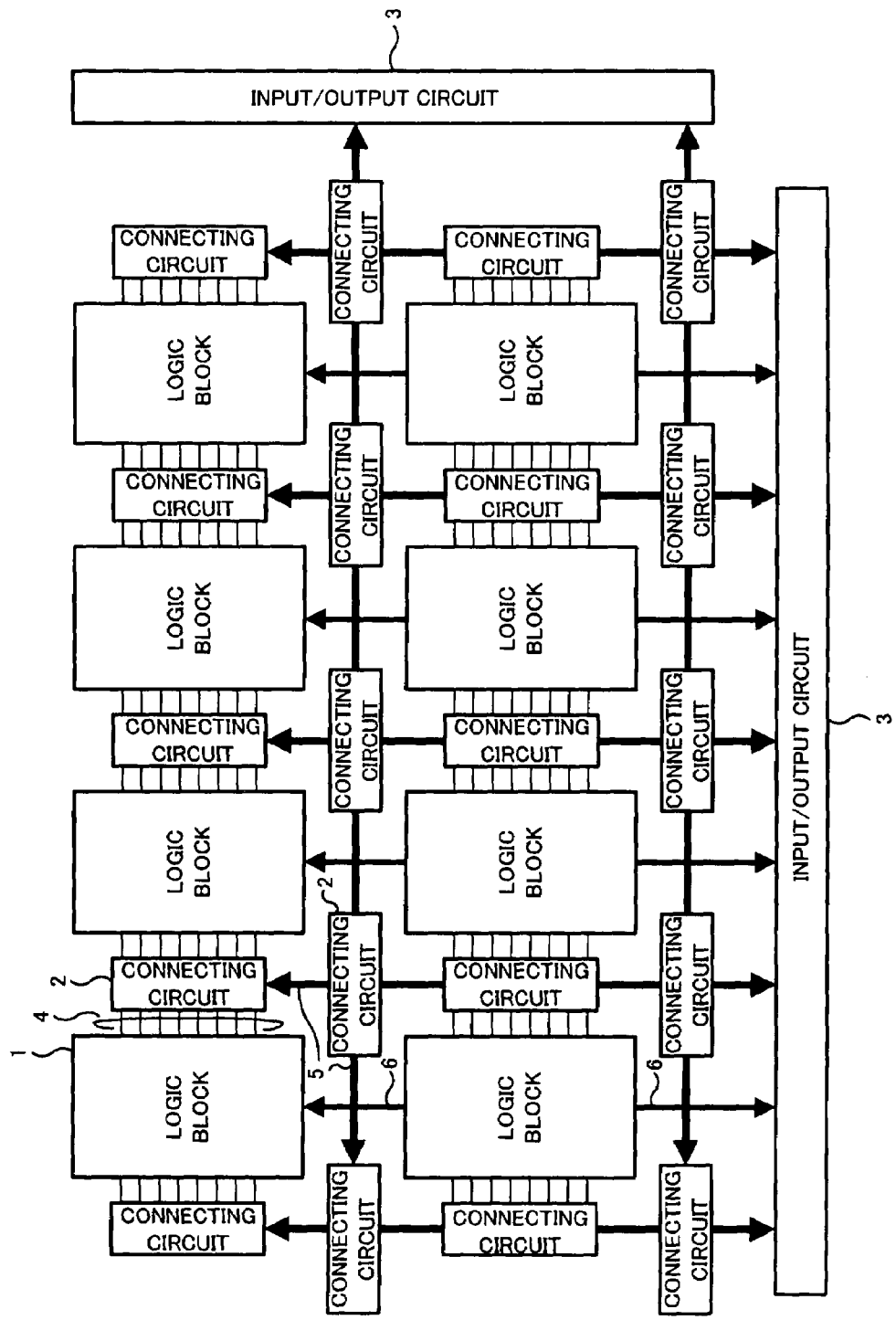
FIG. 9 is a block diagram showing an entire configuration of a programmable logic LSI as an example of a semiconductor device of a second embodiment.

In a second embodiment, a case will be described in which a DRAM circuit having a function of a general input/output interface in addition to the configuration of the first embodiment. FIG. 9 is a block diagram showing an entire configuration of a programmable logic LSI as an example of a semiconductor device of the second embodiment. The programmable logic LSI as shown in FIG. 9 includes a plurality of logic blocks 1, a plurality of connecting circuits 2 and two input/output circuits 3, and a basic configuration is common to FIG. 1 (the first embodiment). Meanwhile, it is different from the first embodiment in that input/output lines 6 each connecting between the logic blocks 1 or between the logic block 1 and one input/output circuit 3 are arranged in addition to the input/output lines 4 and the connection bus 5 which are the same as in FIG. 1.

In the following, specific configuration and operation of a DRAM macro circuit 10 included in the logic block 1 of the second embodiment will be described. Hereinafter, as shown in FIGS. 2 and 3, configurations and operations of the logic circuit 11 in the logic block 1, the configuration memory 20 and the switching matrix 21 in the connecting circuit 2 are the same as those in the first embodiment, so description thereof will be omitted.

Figure 10:
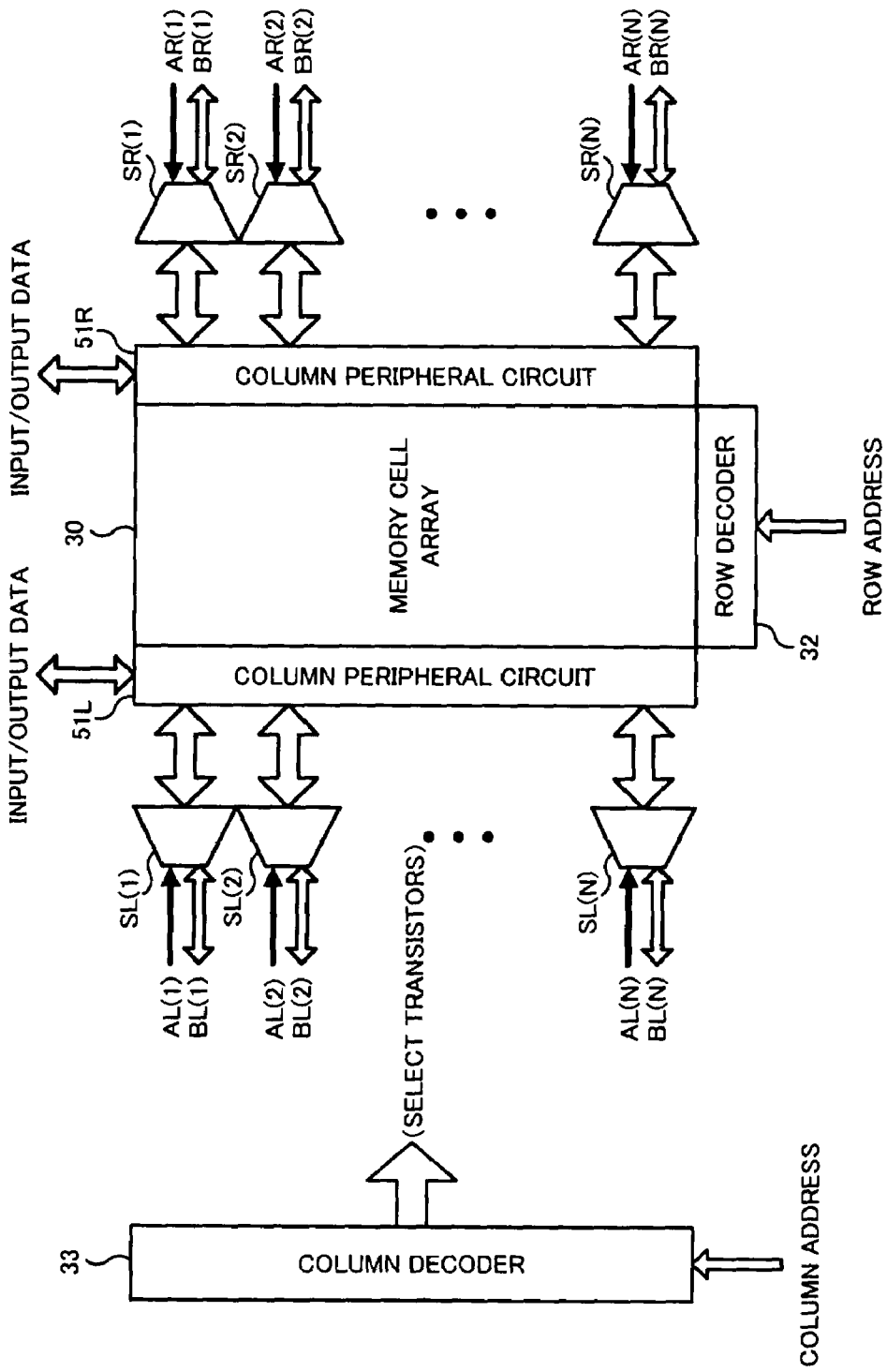
FIG. 10 is a block diagram showing a schematic configuration of a DRAM macro circuit of the second embodiment.

FIG. 10 is a block diagram showing a schematic configuration of the DRAM macro circuit 10 of the second embodiment. The DRAM macro circuit 10 as shown in FIG. 10 includes a memory cell array 30, two column peripheral circuits 51L and 51R, a row decoder 32, a column decoder 33, and a plurality of selectors SL and SR. In FIG. 10, by comparing with FIG. 4 of the first embodiment, it is different in that the column decoder 33 is arranged in addition to the row decoder 32 and the general input/output interface of the DRAM circuit can be utilized in the column peripheral circuits 51L and 51R on the both sides. Reflecting these differences, the column peripheral circuits 51L and 51R are configured differently from the column peripheral circuits 31L and 31R of the first embodiment, but detailed description will be made later.

The column decoder 33 selectively activates one of a plurality of select control lines in response to an input column address. A predetermined bit line pair BP is connected to an input/output port through select transistors, which will be described later, by the activated select control line. Thus, the column decoder 33 operates when using the general input/output interface, being independent of operation of the selectors SL and SR. In addition, configurations and operations of the memory cell array 30 and the row decoder 32 is the same as those of the first embodiment. Further, the example in which the selectors SL and SR of FIG. 10 are arranged in the same manner as the selectors SL and SR of FIG. 4 is shown.

Figure 11:
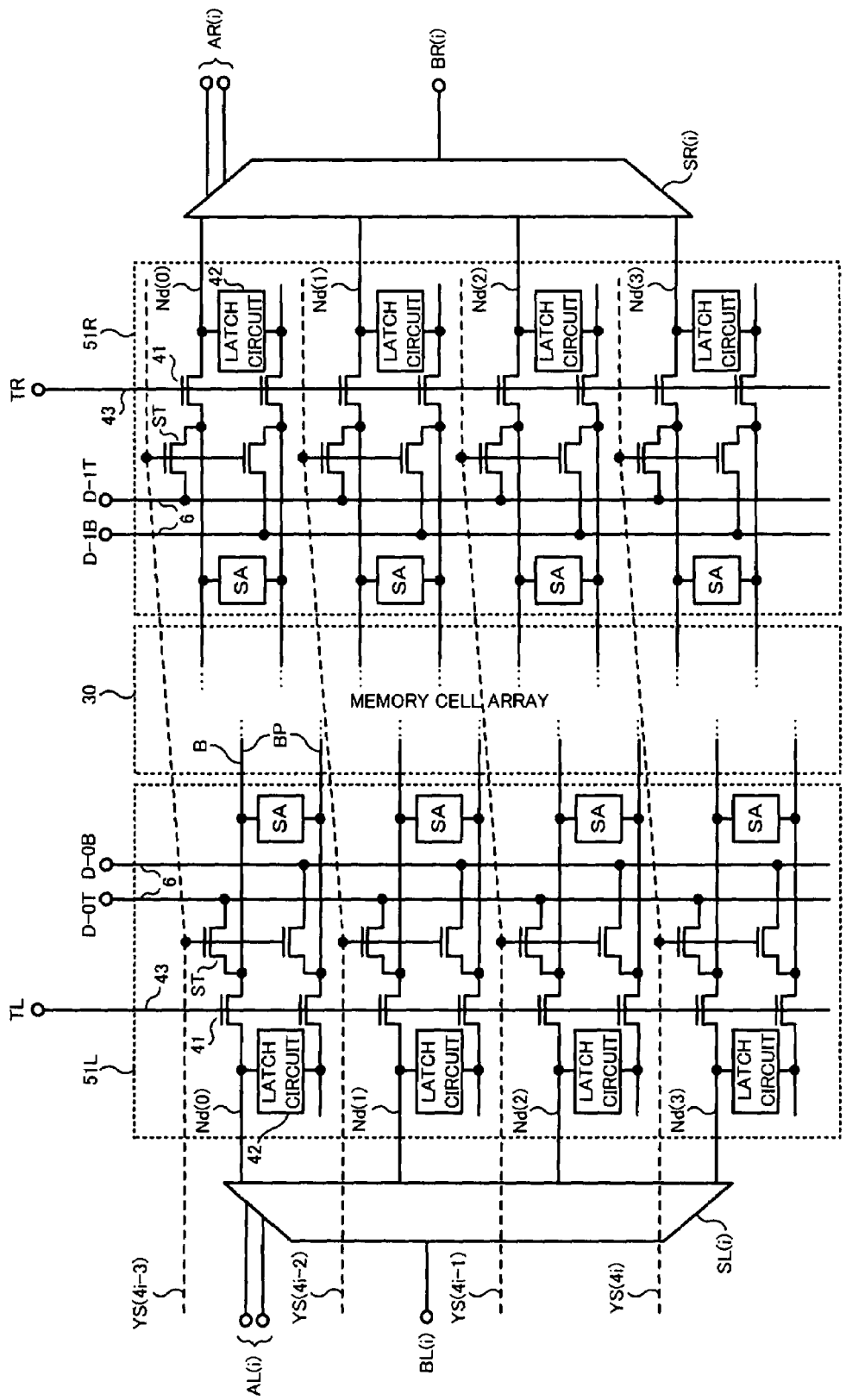
FIG. 11 is a diagram showing a specific configuration of column peripheral circuits and selectors of FIG. 10.

FIG. 11 shows a specific configuration of the column peripheral circuits 51L and 51R and the selectors SL and SR of FIG. 10. In FIG. 11, a circuit portion corresponding to two selectors SL(i) and SR(i) on both sides located at an i-th position from the upper side like in FIG. 6, and eight bit line pairs BP and its peripheral circuits are shown.

Each of the column peripheral circuits 51L and 51R includes one sense amplifier SA, two select transistors ST, two switch transistors 41 and one latch circuit 42 as constituent elements attached to each single bit line pair BP from the near side of the memory cell array 30. In addition, the arrangement of the sense amplifier SA, the two select transistors ST, the two switch transistors 41 and the latch circuit 42 are approximately symmetrical in the column peripheral circuits 51L and 51R on the both sides.

Although, the sense amplifiers SA, the switch transistors 41 and the latch circuits 42 in the configuration of FIG. 11 are arranged in the same manner as in FIG. 6, it is a feature that the select transistors ST are additionally arranged. Each select transistor ST is connected between the sense amplifier SA and the switch transistor 41, and to the gate of which one of different select control lines YS is connected for each bit line pair BP. The select transistor ST is connected at one end to the bit line B, while being connected at the other end to one of a pair of the input/output lines 6.

In the left side column peripheral circuit 51L, a pair of terminals D-0T and D-0B are provided at ends of the pair of input/output lines 6. Similarly, in the right side column peripheral circuit 51R, a pair of terminals D-1T and D-1B are provided at ends of the pair of the input/output lines 6. Data corresponding to a bit line pair BP is input/output through the pair of terminals D-0T and D-0B or the pair of terminals D-1T and D-1B. In the DRAM macro circuit 10, an input/output port having these two pairs of terminals D-0T, D-0B, D-1T and D-1B is defined and transmits data of 2 bits in total. The input/output port is externally connected through the input/output lines 6 outside the DRAM macro circuit 10, and thereby data input/output according to the general DRAM interface can be achieved.

In addition, the input/output lines 6 extend in a direction intersecting the bit lines B, and are commonly connected to a plurality of select transistors ST corresponding to all the bit line pairs BP. Thus, the bit width of the input/output port is maintained constant regardless of whether the number of the bit lines B is increased or decreased. For example, in the configuration of FIG. 11, the bit width of the input/output port is maintained 2 bits regardless of the number of the bit lines B.

In FIG. 11, eight bit line pairs BP at (8i−7)-th to 8i-th positions from the upper side of the memory cell array 30 are arranged corresponding to selectors SL(i) and SR(i) at an i-th position from the upper side. Thus, four select control lines YS(4i−3), YS(4i−2), YS(4i−1) and YS(4i) output from the column decoder 33 of FIG. 10 are shown corresponding to the above bit line pairs BP. For example, when one select control line YS(4i−3) is activated, four select transistors ST, each two of which are on each of both sides, are connected to two bit line pairs BP on the upper side of FIG. 11, and turn on, so that 2-bit data is output to the input/output port through the select transistors ST. Regarding other select control lines YS(4i−2), YS(4i−1) and YS(4i), the same operation is performed.

Meanwhile, regarding operations of the sense amplifier SA, the switch transistor 41 and the latch circuit 42 are common to those in the same manner as in the first embodiment, and corresponding selection operation of the selectors SL(i) and SR(i) are also the same.

Figure 12:
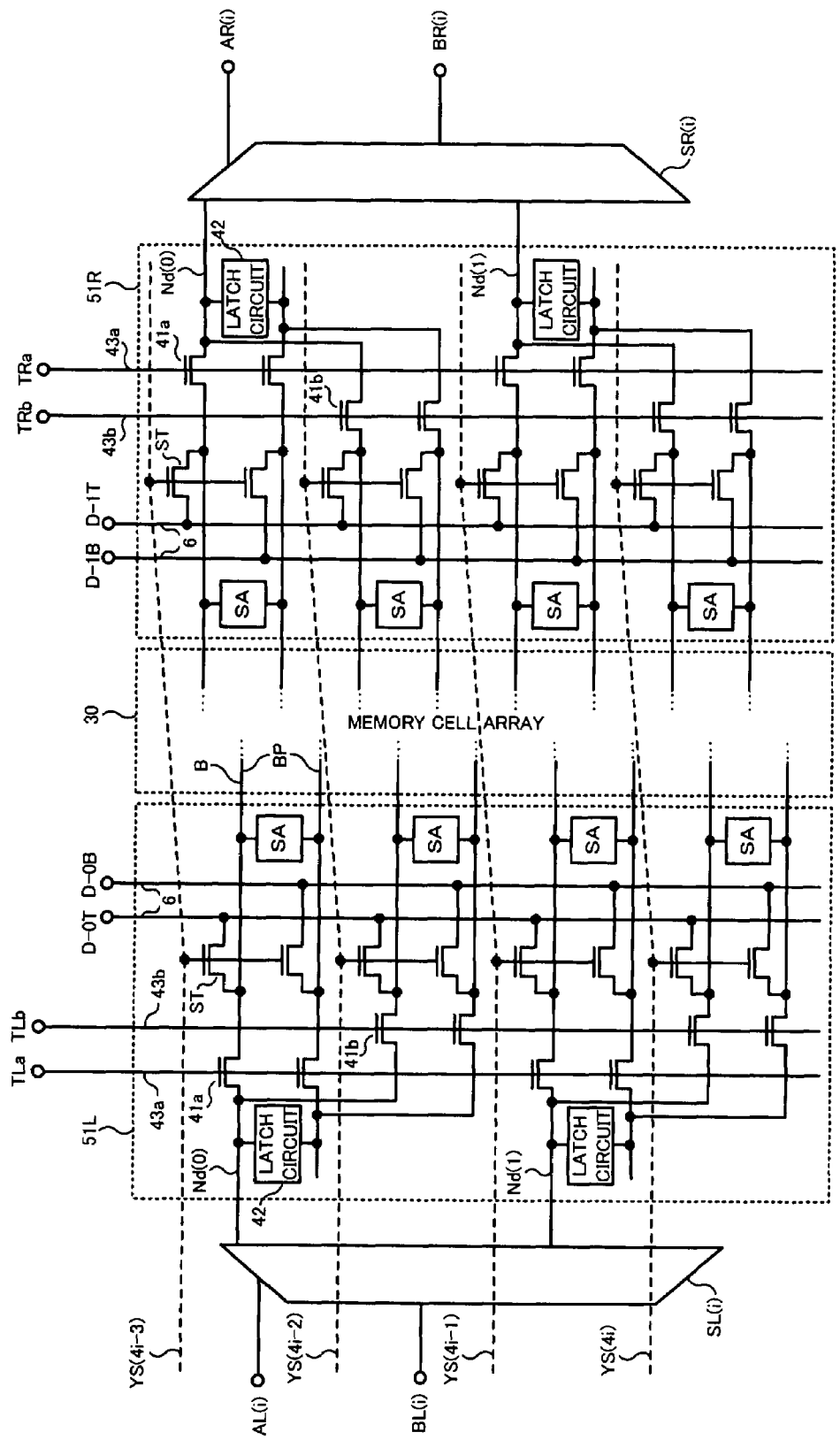
FIG. 12 is a block diagram showing a modification of the DRAM macro circuit of the second embodiment.

Next, a modification corresponding to the configuration of FIG. 11 will be described. FIG. 12 shows the modification of the configuration of FIG. 11 from the same viewpoint as in FIG. 7 of the first embodiment. Configurations and operations of the column peripheral circuits 51L and 51R and the selectors SL(i) and SR(i) on the both sides shown in FIG. 12 are the same as in FIG. 7, so description thereof will be omitted.

Figure 13:
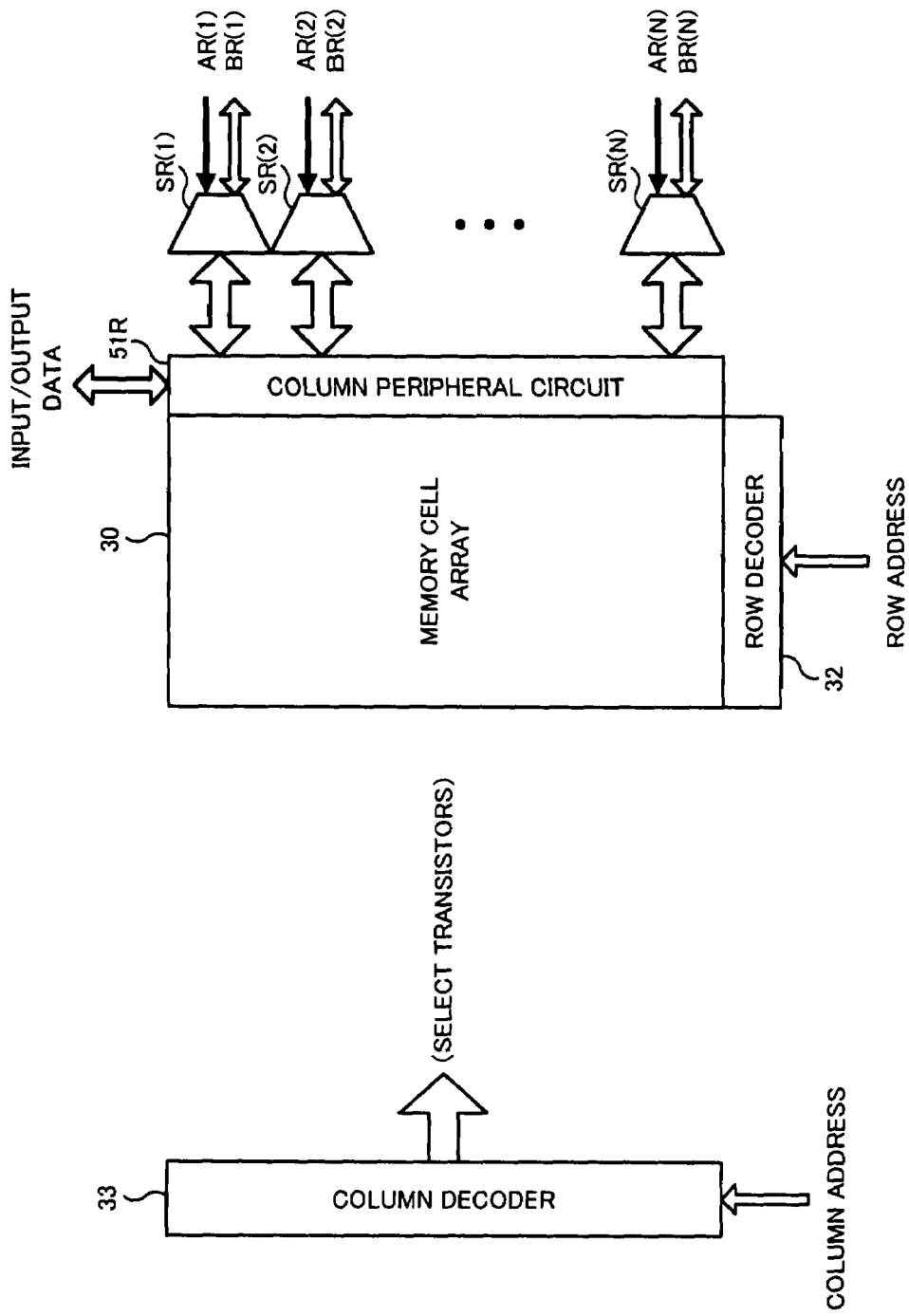
FIG. 13 is a block diagram showing a modification regarding the schematic configuration of the DRAM macro circuit of the second embodiment.

Next, a modification of the schematic configuration of the DRAM macro circuit 10 of the second embodiment is shown. FIG. 13 shows the modification from the same viewpoint as in FIG. 8 of the first embodiment. In the modification shown in FIG. 13, there are provided the column peripheral circuit 51R, N selectors SR(1) to SR(N) and the column decoder 33, which are arranged only on the right side of the memory cell array 30. The meaning of this configuration is the same as in FIG. 8, so its description will be omitted.

As described above, a plurality of LUT for implementing various logic functions is configured by the DRAM macro circuit 10 of the second embodiment as in the first embodiment, and additionally data input/output according to the general DRAM interface can be achieved. The LUT data stored in all or part of the memory cell array 30 of the DRAM macro circuit 10 is used, and the memory cell array 30 can be accessed at the same time using the general DRAM interface. For example, when the memory cell array is shared for both the LUT data and the work area, both data can be input/output at high speed through different access paths, so that the DRAM macro circuit 10 can be effectively utilized. Further, by configuring a programmable logic LSI in which the DRAM macro circuit 10 of the second embodiment is implemented, for example, the LUT data can be updated in the background, or the testing of the memory cell array 10 can be smoothly executed without hindering the logic functions.

In the foregoing, the present invention is specifically described based on the embodiments. However, the present invention is not limited to the above described two embodiments, and can be variously modified without departing the essentials of the present invention. In the above embodiments, a case to which the present invention is applied using a DRAM circuit as a memory circuit has been described. However, the present invention can be widely applied to cases of using a SRAM or a nonvolatile RAM as the memory circuit. Further, in the above embodiments, a configuration in which the memory circuit of the invention is implemented in a programmable logic LSI has been described. However, the present invention can be widely applied to other semiconductor devices capable of achieving the same function.

The present invention is not limited to the above described embodiments, and various variations and modifications may be possible without departing from the scope of the present invention.

This application is based on the Japanese Patent application No. 2006-279299 filed on Oct. 12, 2006, entire content of which is expressly incorporated by reference herein.

What is claimed is:

1. A semiconductor device comprising:
   a plurality of word lines;
   a plurality of bit lines each intersecting each of the word lines;
   a plurality of memory cells each disposed at an associated one of intersections of the word and bit lines;
   a plurality of sense amplifiers each operatively connected to an associated one of the bit lines to amplify a data signal on the associated one of the bit lines;
   a plurality of data holding circuits each temporally storing data from an associated one of the sense amplifiers, the data holding circuits being divided into a plurality of groups each including plural data holding circuits;
   a plurality of selectors each provided for an associated one of the groups and each including a plurality of input nodes and an output node, the input nodes of each of the selectors being connected respectively to the data holding circuits of an associated one of the groups, each of the selectors selecting one of the input nodes in response to logic input data supplied thereto and connecting a selected one of the input nodes to the output node; and
   a set of data terminals each connected to the output node of an associated one of the selectors.

2. The device as claimed in claim 1, wherein the logic input data is supplied in common to the selectors.

3. The device as claimed in claim 1, wherein one of the data holding circuits is provided per one of the sense amplifiers.

4. The device as claimed in claim 1, wherein one of the data holding circuits is provided per plural ones of the sense amplifiers.

5. The device as claimed in claim 1, further comprising at least one random access port, and an additional selector responding to column address information and electrically connecting at least one of the sense amplifiers to the at least one random access port.

6. A semiconductor device comprising:
- a plurality of word lines;
- a plurality of first bit lines each intersecting each of the word lines;
- a plurality of second bit lines each intersecting each of the word lines;
- a plurality of memory cells each disposed at an associated one of intersections of the word lines and the first and second bit lines;
- a plurality of first sense amplifiers each operatively connected to an associated one of the first bit lines to amplify a data signal on the associated one of the first bit lines;
- a plurality of second sense amplifiers each operatively connected to an associated one of the second bit lines to amplify a data signal on the associated one of the second bit lines;
- a plurality of first data holding circuits each temporally storing data from an associated one of the first sense amplifiers, the first data holding circuits being divided into a plurality of first groups each including plural first data holding circuits;
- a plurality of second data holding circuits each temporally storing data from an associated one of the second sense amplifiers, the second data holding circuits being divided into a plurality of second groups each including plural second data holding circuits;
- a plurality of first selectors each provided for an associated one of the first groups and each including a plurality of input nodes and an output node, the input nodes of each of the first selectors being connected respectively to the first data holding circuits of an associated one of the first groups, each of the first selectors selecting one of the input nodes in response to first logic input data supplied thereto and connecting a selected one of the input nodes to the output node;
- a plurality of second selectors each provided for an associated one of the second groups and each including a plurality of input nodes and an output node, the input nodes of each of the second selectors being connected respectively to the second data holding circuits of an associated one of the second groups, each of the second selectors selecting one of the input nodes in response to second logic input data supplied thereto and connecting a selected one of the input nodes to the output node;
- a set of first data terminals each connected to the output node of an associated one of the first selectors; and
- a set of second data terminals each connected to the output node of an associated one of the second selectors.

7. The device as claimed in claim 6, wherein the first logic input data is supplied in common to the first selectors and the second logic input data is supplied in common to the second selectors.

8. The device as claimed in claim 6, wherein one of the first data holding circuits is provided per one of the first sense amplifiers and one of the second data holding circuits is provided per one of the second sense amplifiers.

9. The device as claimed in claim 7, wherein one of the first data holding circuits is provided per plural ones of the first sense amplifiers and one of the second data holding circuits is provided per plural ones of the second sense amplifiers.

10. The device as claimed in claim 7, further comprising at least one first random access port, at least one second random access port, a first additional selector responding to first column address information and electrically connecting at least one of the first sense amplifiers to the at least one first random access port, and a second additional selector responding to second column address information and electrically connecting at least one of the second sense amplifiers to the at least one second random access port.

11. The device as claimed in claim 7, wherein the word lines, the first and second bit lines and the memory cells are disposed in a first area, the first sense amplifiers, the first data holding circuits and the first selectors being disposed in a second area, and the second sense amplifiers, the second data holding circuits and the second selectors being disposed in a third area, and the first area being sandwiched between the second and third areas.

12. A semiconductor device comprising:
- a memory macro circuit; and
- a logic circuit coupled to the memory macro circuit to performed on data supplied from the memory macro circuit,
- wherein the memory macro circuit comprises:
  - a plurality of word lines;
  - a plurality of first bit lines each intersecting each of the word lines;
  - a plurality of first memory cells each disposed at an associated one of intersections of the word lines and the bit lines;
  - a plurality of first sense amplifiers each operatively connected to an associated one of the first bit lines to amplify a data signal on the associated one of the first bit lines;
  - a plurality of first data holding circuits each temporally storing data from an associated one of the first sense amplifiers, the first data holding circuits being divided into a plurality of first groups each including plural first data holding circuits;
  - a plurality of first selectors each provided for an associated one of the first groups and each including a plurality of input nodes and an output node, the input nodes of each of the first selectors being connected respectively to the first data holding circuits of an associated one of the first groups, each of the first selectors selecting one of the input nodes in response to first logic input data supplied thereto and connecting a selected one of the input nodes to the output node; and
  - a set of first data terminals each connected to the output node of an associated one of the first selectors,
- wherein the logic circuit is coupled to the memory macro circuit through the set of first data terminals.

13. The device as claimed in claim 12, wherein the logic input data is supplied in common to the selectors from the logic circuit.

14. The device as claimed in claim 12, wherein the memory macro circuit further comprises at least one random access port, and an additional selector responding to column address information and electrically connecting at least one of the sense amplifiers to the at least one random access port.

15. The device as claimed in claim 14, wherein the logic circuit performs a random access operation on the memory macro circuit through the random access port.

16. The device as claimed in claim 12, wherein the memory macro circuit further comprises:
- a plurality of second bit lines each intersecting each of the word lines;
- a plurality of second memory cells each disposed at an associated one of intersections of the word lines and the second bit lines;
- a plurality of second sense amplifiers each operatively connected to an associated one of the second bit lines to amplify a data signal on the associated one of the second bit lines;

a plurality of second data holding circuits each temporally storing data from an associated one of the second sense amplifiers, the second data holding circuits being divided into a plurality of second groups each including plural second data holding circuits;

a plurality of second selectors each provided for an associated one of the second groups and each including a plurality of input nodes and an output node, the input nodes of each of the second selectors being connected respectively to the second data holding circuits of an associated one of the second groups, each of the second selectors selecting one of the input nodes in response to second logic input data supplied thereto and connecting a selected one of the input nodes to the output node; and a set of second data terminals each connected to the output node of an associated one of the second selectors.

17. The device as claimed in claim 16, wherein the word lines, the first and second bit lines and the memory cells are disposed in a first area, the first sense amplifiers, the first data holding circuits and the first selectors being disposed in a second area, and the second sense amplifiers, the second data holding circuits and the second selectors being disposed in a third area, and the first area being sandwiched between the second and third areas.

* * * * *